United States Patent

Radzilowski et al.

(10) Patent No.: US 10,276,937 B2
(45) Date of Patent: Apr. 30, 2019

(54) JET DISPENSING ELECTRICALLY CONDUCTIVE INKS

(71) Applicant: TE Connectivity Corporation, Berwyn, PA (US)

(72) Inventors: Leonard H. Radzilowski, Palo Alto, CA (US); Miguel A. Morales, Fremont, CA (US); Michael A. Oar, San Francisco, CA (US); Anthony B. Idem, Union City, CA (US); Yiliang Wu, San Ramon, CA (US); Barry C. Mathews, Fremont, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/436,375

(22) Filed: Feb. 17, 2017

(65) Prior Publication Data

US 2018/0242458 A1    Aug. 23, 2018

(51) Int. Cl.
| | |
|---|---|
| B05D 5/12 | (2006.01) |
| H01Q 9/04 | (2006.01) |
| H05K 3/12 | (2006.01) |
| H05K 1/09 | (2006.01) |
| H05K 1/03 | (2006.01) |
| H05K 3/28 | (2006.01) |
| C09D 11/30 | (2014.01) |
| C09D 11/52 | (2014.01) |

(52) U.S. Cl.
CPC ........... *H01Q 9/0414* (2013.01); *C09D 11/30* (2013.01); *C09D 11/52* (2013.01); *H05K 1/0313* (2013.01); *H05K 1/097* (2013.01); *H05K 3/1241* (2013.01); *H05K 3/1283* (2013.01); *H05K 3/28* (2013.01); *H05K 2203/163* (2013.01)

(58) Field of Classification Search
CPC .......................... H05K 3/1283; H05K 3/1241
USPC ........................................................ 427/58
See application file for complete search history.

(56) References Cited

U.S. PATENT DOCUMENTS

| 5,320,250 A | 6/1994 | La et al. |
| 2006/0157517 A1* | 7/2006 | Fiske ..................... B05C 5/001 222/504 |
| 2012/0075385 A1 | 3/2012 | Kozee et al. |
| 2015/0037550 A1 | 2/2015 | Balasubramaniam et al. |
| 2015/0132476 A1 | 5/2015 | Wu et al. |

FOREIGN PATENT DOCUMENTS

| WO | WO-2010/144343 A2 | 12/2010 |
| WO | WO-2012/171936 A1 | 12/2012 |

OTHER PUBLICATIONS

Lu et al. "Nozzle and needle during high viscosity adhesive jetting based on piezoelectric jet dispensing" (Sep. 9, 2015).*
International Search Report dated May 11, 2018, for International Application No. PCT/US2018/018441.
Shu et al., "Experimental Study on High Viscosity Fluid Microdroplet Jetting System", *Sci. China Tech. Sci.*, vol. 53, pp. 182-187, 2010.
Quinones et al., "Jetting Technology for Microelectronics", *IMPAS Nordic*, Stockholm, Sweden, Sep. 2012.

* cited by examiner

*Primary Examiner* — Austin Murata

(57) ABSTRACT

A method of forming a conductive trace that includes selecting a substrate, jet dispenser, and conductive ink; measuring the ink's viscosity ($V_m$); using $V_m$ to select one of criteria (i)-(iv): applying the selected criteria to the dispenser; applying the ink onto the substrate; and drying, curing, or annealing the ink to form the conductive trace having ≥4B adhesion. The criteria (i)-(iv) including:
(i) ($V_m$)>2.0 Pa-s, then (1) add a fluid—repeat D)-E) or (2) repeat C)-E);
(ii) 2.0 Pa-s≥$V_m$>0.35 Pa-s, use needle diameter ≥3.0 mm & nozzle diameter (d)≥0.15 mm with ratio of nozzle length (L) to nozzle diameter (d)≤30;
(iii) $V_m$<0.25 Pa-s, use a needle diameter ≥1.0 mm and <3.0 mm & nozzle diameter ≥0.15 mm with L/d≤30; or
(iv) 0.25 Pa-s≤$V_m$≤0.35 Pa-s, use criteria (ii) or (iii).

18 Claims, 8 Drawing Sheets

60A

60A

60A

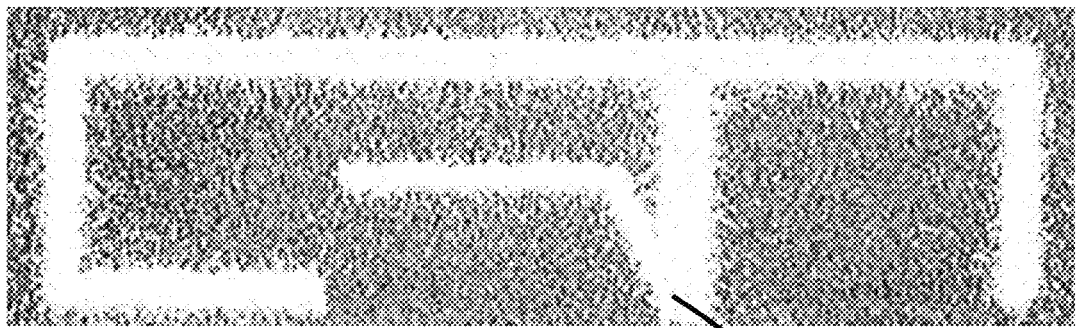
Figure 3A    60B
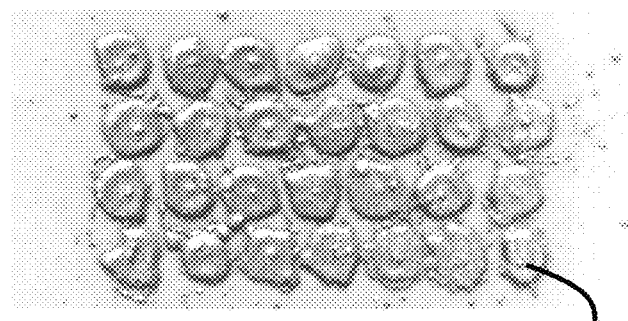
Figure 3B    60B    60B
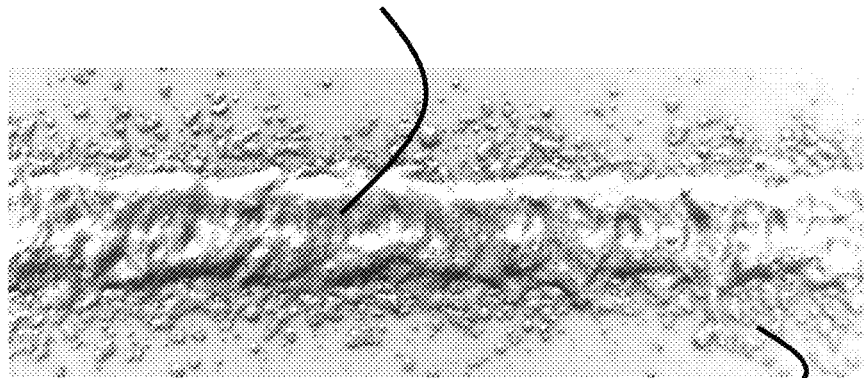
Figure 3C    62

| 30°C | Ink #1 | Ink #2 | Ink #3 | Ink #4 |
|---|---|---|---|---|
| Nozzle Diameter (mm) | 5.0 Pa-sec at 700 sec$^{-1}$ | 2.0 Pa-sec at 700 sec$^{-1}$ | 0.8 Pa-sec at 700 sec$^{-1}$ | 0.25 Pa-sec at 700 sec$^{-1}$ |
| 0.10 | | Lines= YES Dots = NO | Lines= YES Dots = NO | |
| 0.15 | Lines= NO Dots = NO | Lines= YES Dots = YES | Lines= YES Dots = YES | Lines= Yes, limited Dots = Yes, Limited |
| 0.20 | Lines= NO Dots = NO | Lines= YES Dots = YES | Lines= YES Dots = YES | Lines= YES Dots = YES |
| 0.25 | Lines= NO Dots = NO | Lines= YES | | |

| 55°C | Ink #1 | Ink #2 | Ink #3 | Ink #4 |
|---|---|---|---|---|
| Nozzle Diameter (mm) | 2.0 Pa-sec at 700 sec$^{-1}$ | 0.8 Pa-sec at 700 sec$^{-1}$ | 0.35 Pa-sec at 700 sec$^{-1}$ | 0.15 Pa-sec at 700 sec$^{-1}$ |
| 0.10 | | Lines= YES Dots = NO | Lines= YES Dots = NO | |
| 0.15 | Lines= YES Dots = YES | Lines= YES Dots = YES | Lines= YES Dots = YES | Lines= Yes, limited Dots = Yes, Limited |
| 0.20 | Lines= YES Dots = NO | Lines= YES Dots = YES | Lines= YES Dots = YES | Lines= Yes, limited Dots = Yes, Limited |
| 0.25 | Lines= NO Dots = NO | Lines= YES | | |

Figure 8

JET DISPENSING ELECTRICALLY CONDUCTIVE INKS

FIELD

This disclosure relates generally to a method of jet dispensing electrically conductive inks.

BACKGROUND

The statements in this section merely provide background information related to the present disclosure and may not constitute prior art.

Conductive inks have been used for several decades to form conductive traces on a variety of flat, two dimensional (2-D) substrates or articles, such as circuit boards and flexible plastic films. One of the more common methods of depositing these inks onto these articles is screen printing.

In order to print on more complex substrate geometries that have a three-dimensional (3-D) shape, however, other print methods, such as pad printing, must be utilized. In pad printing, the ink is applied as a pattern to the surface of a conformable pad, which then makes contact with the 3-D surface of the substrate in order to transfer the ink. However, even pad printing cannot be utilized in some applications where the substrate geometry is more complex.

In this case, a print head that ejects drops of ink from a distance above the substrate's surface is utilized. In order to print a substrate that has a very complex 3-D geometry, a large distance between the print head and the substrate is desirable. Commercially available print heads generally contain a nozzle or orifice through which ink is ejected in discrete drops, one at a time, as well as a valve that regulates the flow of the ink. Pressure is applied to help force the ink through the nozzle. The closing action associated with the valve also produces a significant force, which assists in ejecting the drops from the nozzle. When the valve is opened and closed in rapid succession, a stream of drops can be produced.

The method of printing that uses a print head to eject drops of ink onto a substrate should be distinguished from the method in which ink flows from a channel or other orifice that is in close proximity to the substrate's surface as a continuous filament of ink. In addition, this method of printing should also be distinguished from inkjet printing, which requires inks with very specific rheological properties, for example, less than 0.02 pascal second (Pa-s) in viscosity.

SUMMARY

The present disclosure generally provides a method of jet dispensing electrically conductive inks onto the surface of a substrate in order to form a conductive tracing thereon. This method includes the steps of: A) selecting a substrate; B) providing a jet dispenser for use in applying a conductive ink to the substrate; C) selecting a conductive ink; D) measuring the viscosity of the conductive ink at a shear rate of 700 $sec^{-1}$ and a predetermined jetting temperature; E) using the measured viscosity to select one of the criteria (i)-(iv) to apply to the jet dispenser as further defined below and described herein; F) applying the selected criteria to the jet dispenser; G) using the jet dispenser to apply the conductive ink on to a surface of the substrate; and H) drying, curing, and optionally annealing the conductive ink to form the conductive trace, wherein the conductive trace exhibits a 4B or higher level of adhesion.

According to criteria (i), when the measured viscosity is greater than 2.0 Pa-s, either (1) a fluid is added to the conductive ink in order to reduce the viscosity thereof followed by repeating steps D) and E) or (2) another conductive ink is selected by repeating steps C)-E). According to criteria (ii), when the measured viscosity is less than or equal to 2.0 Pa-s and greater than 0.35 Pa-s, a needle that is at least 3.0 mm in diameter and an orifice or nozzle that is at least 0.15 mm in diameter (d) is used with the proviso that the ratio of nozzle length (L) to nozzle diameter (d) is ≤30. This needle simply regulates flow through the nozzle by retracting and closing; wherein the action of closing also creates a force on the fluid. One skilled in the art will understand that fluid does not flow through this needle. According to criteria (iii), when the measured viscosity is less than 0.25 Pa-s, a needle that is at least 1.0 mm in diameter but less than 3.0 mm in diameter and an orifice or nozzle that is at least 0.15 mm in diameter (d) is used with the proviso that the ratio of nozzle length (L) to nozzle diameter (d) is ≤30. Finally, according to criteria (iv), when the measured viscosity is between 0.25 Pa-s and 0.35 Pa-s, the criteria set forth in either (ii) or (iii) is selected and used.

According to one aspect of the present disclosure, the jet dispenser may comprise a non-contact pulsable, piezo-actuated dispensing valve or a non-contact, pneumatic piston valve. The jet dispenser is capable of being fired in rapid succession at a rate up to 250 Hz. The jet dispenser may also be capable of dispensing deposits of the conductive ink equal to or greater than one nanoliter (nL) with a dot diameter on the order of 200 µm (0.008 in) or more. When desirable, the jet dispenser is similar to a DispenseJet™ DJ-9500 jet dispenser (Nordson ASYMTEK, Carlsbad, Calif.).

According to another aspect of the present disclosure, the surface of the substrate may be 2-dimensional (2-D) or 3-dimensional (3-D) in shape. The substrate is a plastic substrate that may be formed, without limitation, from a polycarbonate, an acrylonitrile butadiene styrene (ABS), a polyamide, or a polyester, a polyimide, vinyl polymer, polystyrene, polyether ether ketone (PEEK), polyurethane, epoxy-based polymer, polyethylene ether, polyether imide (PEI), polyolefin, or a polyvinylidene fluoride (PVDF) material. Alternatively, the substrate may comprise a plastic, a glass, a ceramic, or a metal.

The conductive ink may comprise, but not be limited to, silver particles, silver flakes, gold particles, gold flakes, copper particles, copper flakes, palladium particles, palladium flakes, platinum particle, platinum flakes, or a combination thereof. The particles may include, without limitation, nanoparticles (<100 nanometers (nm)), submicron particles (<1 micrometer (µm)), micron-sized particles (≥1 micrometer (µm)), or a combination thereof. When desirable, the particles may exhibit a particle size distribution defined by a $D_{90}$ value that is 10 µm or less. The $D_{90}$ value is defined as the particle size value that corresponds to a cumulative size distribution at 90%, which represents the size of particles below which 90% of the particles lie.

According to another aspect of the present disclosure, the method may further comprise the steps of: applying a primer layer to the surface of the substrate prior to the application of the conductive ink; and at least partially curing the primer layer. In this case, the conductive ink is applied onto the surface of the primer layer. The conductive ink may be dried or annealed at ambient or room temperature or at a temperature that is greater than ambient temperature. Alternatively, the temperature is less than about 200° C.; alternatively, less than about 160° C.; alternatively, no more than 120° C. for a period of time ranging between about 2 minutes to about 60 minutes. When desirable, the method may further comprise treating the surface of the substrate prior to the application of the primer layer. This surface treatment may include, without limitation, the use of atmospheric/air plasma, flame atomization, atmospheric chemical plasma, vacuum chemical plasma, UV exposure, UV-ozone exposure, heat treatment, chemical treatment, solvent treatment, mechanical treatment, or a corona charging process. Chemical treatment may include functionalization of the surface using known coupling agents or other surface treatments, including but not limited to alkoxy silanes.

According to yet another aspect of the present disclosure, the conductive ink may comprise silver nanoparticles having an average particle diameter between about 2 nm and 800 nm. Optionally, one or more of these silver nanoparticles is at least partially encompassed with a hydrophilic coating. The silver nanoparticles may be incompletely fused after annealing, such that the average particle diameter of the silver nanoparticles in the conductive trace after annealing is substantially the same as that in the silver nanoparticle ink.

According to another aspect of the present disclosure, functional conductive layered composites may be formed that incorporate the conductive trace created according to the method described above and further defined herein. This functional conductive layered composite may function, without limitation, as an antenna, as an electrode of an electronic device, or to interconnect two electronic components.

The method of forming a functional conductive layered composite may comprise forming a conductive trace on the surface of a substrate according to steps A) through H), followed by step I) in which the conductive trace is incorporated into a functional conductive layered composite. Optionally, the method may further comprise applying a primer layer to the surface of the substrate prior to the application of the conductive ink and at least partially curing the primer layer. In this case, the conductive ink is applied onto the surface of the primer layer when forming the conductive trace.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIGS. 3A to 3C are conductive traces printed on a 2-D substrate that exhibit significant "overspray" due to the viscosity of the ink being too low resulting in the occurrence of satellite drop generation.

FIG. 8 is a table of results associated with printing conductive traces through a needle having a 3.0 mm diameter and nozzles having various diameters using inks that exhibit different viscosities.

Figure 1:
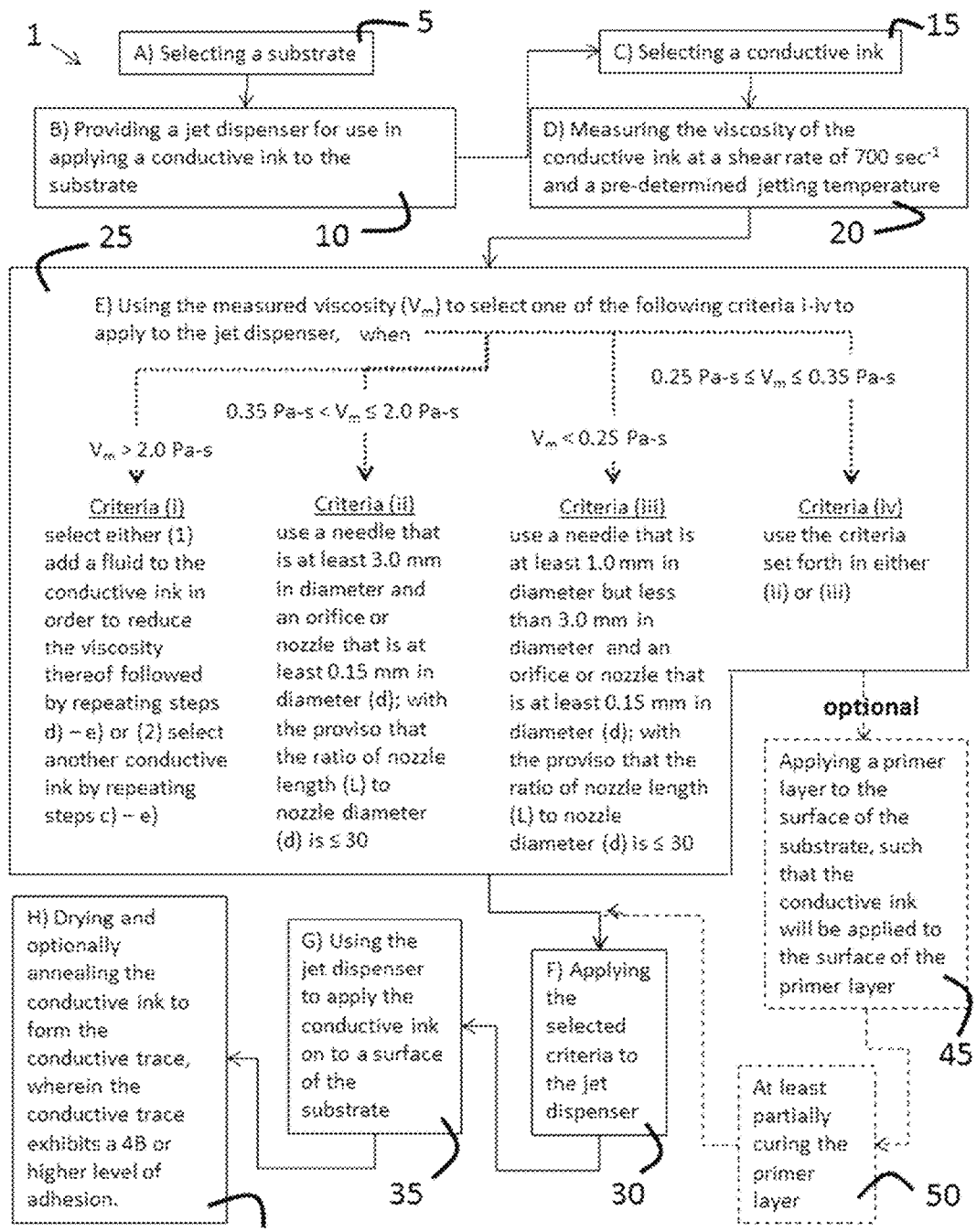
FIG. 1 is a schematic representation of a method of applying a conductive trace to a substrate according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure generally provides a method of jet dispensing electrically conductive inks onto the surface of a substrate in order to form a conductive tracing thereon. Referring to FIG. 1, this method 1 includes the steps of: A) selecting 5 a substrate; B) providing 10 a jet dispenser for use in applying a conductive ink to the substrate; C) selecting 15 a conductive ink; D) measuring 20 the viscosity of the conductive ink at a shear rate of 700 sec$^{-1}$ and a predetermined jetting temperature; E) using 25 the measured viscosity to select one of the criteria (i)-(iv) to apply to the jet dispenser as further defined below and described herein; F) applying 30 the selected criteria to the jet dispenser; G) using 35 the jet dispenser to apply the conductive ink on to a surface of the substrate; and H) drying or curing 40 and optionally annealing the conductive ink to form the conductive trace. In some embodiments, the conductive trace may exhibit a 4B or higher level of adhesion as measured according to the ASTM 3359 standard method (ASTM International, West Conshohocken, Pa.). In other embodiments, the conductive trace may have a lower level of adhesion, and an optional encapsulation layer may be applied on top of the conductive trace and the substrate for protection.

According to criteria (i), when the measured viscosity is greater than 2.0 Pa-s, either (1) a fluid is added to the conductive ink in order to reduce the viscosity thereof followed by repeating steps D)-E) or (2) another conductive ink is selected by repeating steps C)-E). According to criteria (ii), when the measured viscosity is less than or equal to 2.0 Pa-s and greater than 0.35 Pa-s, a needle that is at least 3.0 mm in diameter and an orifice or nozzle that is at least 0.15 mm in diameter (d) is used with the proviso that the ratio of nozzle length (L) to nozzle diameter (d) is ≤30. This needle simply regulates flow through the nozzle by retracting and closing; wherein the action of closing also creates a force on the fluid. One skilled in the art will understand that fluid does not flow through this needle.

According to criteria (iii), when the measured viscosity is less than 0.25 Pa-s, a needle that is at least 1.0 mm in diameter but less than 3.0 mm in diameter and an orifice or nozzle that is at least 0.15 mm in diameter (d) is used with the proviso that the ratio of nozzle length (L) to nozzle diameter (d) is ≤30. Finally, according to criteria (iv), when the measured viscosity is between 0.25 Pa-s and 0.35 Pa-s, the criteria set forth in either (ii) or (iii) is selected and used. Alternatively, the measured viscosity of the conductive ink is between 0.25 Pa-s and 0.35 Pa-s and the criteria set forth in either (ii) or (iii) is selected and used. It should be noted that the viscosity values discussed in this applications refer to the viscosity measured at the predetermined jetting temperature. The predetermined jetting temperature can be, for example, room temperature (23-25° C.), or any temperature from room temperature to about 100° C., including from room temperature to about 60° C. Alternatively, the jetting temperature is from room temperature to about 55° C.

Figure 2A:
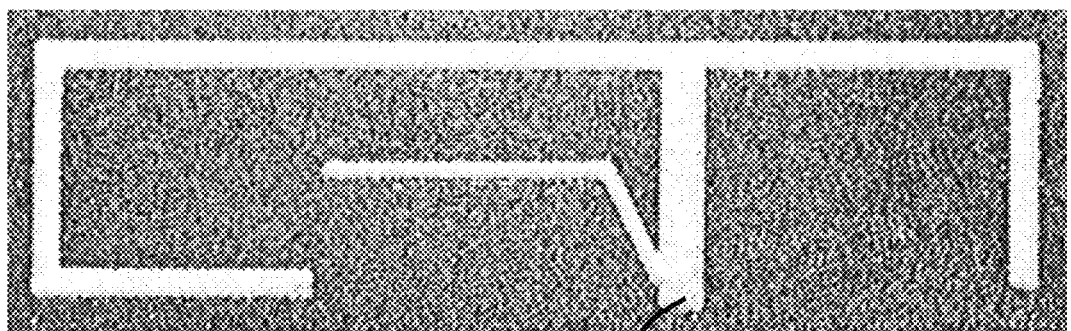
FIGS. 2A to 2C are conductive traces printed on a 2-D substrate using a jet dispenser according to the teachings of the present disclosure.
Figure 2B:
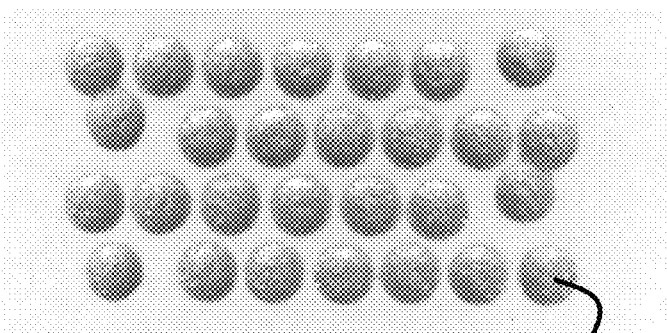
Figure 2C:
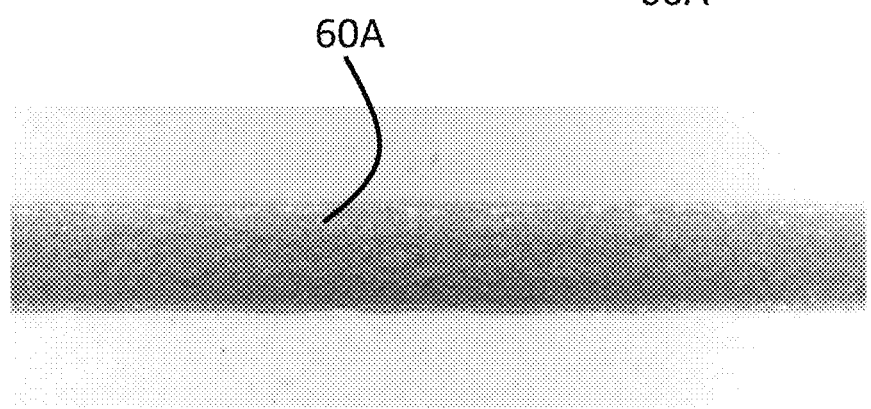
Figure 4A:
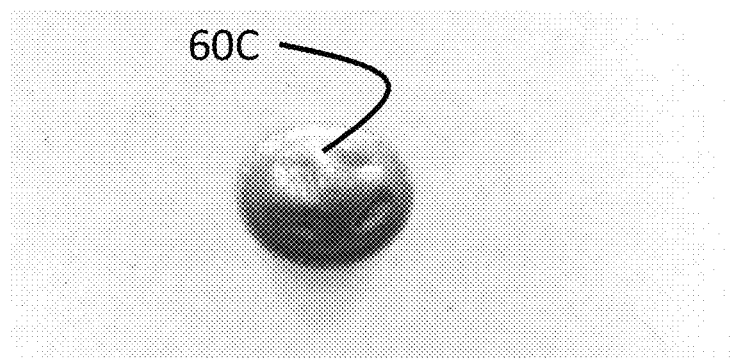
FIGS. 4A and 4B are conductive traces printed on a 2-D substrate that exhibit difficulty in drop ejection due to the viscosity of the ink being too high.
Figure 4B:
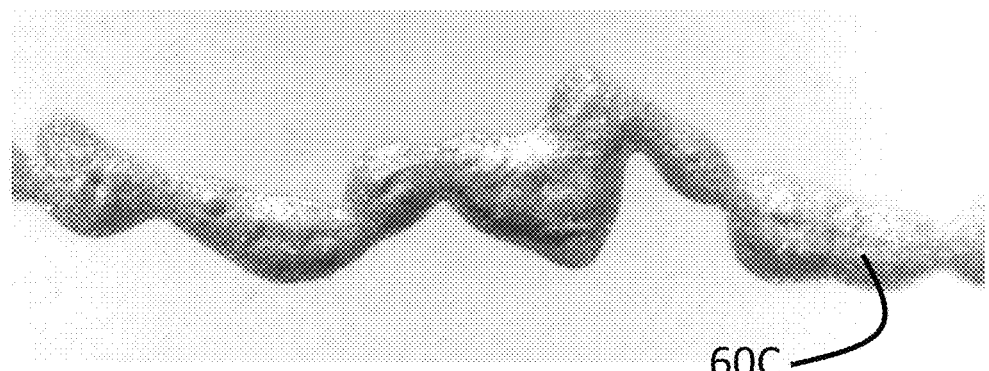

Both material properties of the conductive ink and geometric parameters of the jet dispenser, contribute to whether or not a drop of ink will properly form and break-off from a nozzle when the ink flows to form a conductive trace. A simplified method of predicting successful jetting behavior is accomplished by understanding the interaction between the material properties and the geometric parameters. Conductive inks that exhibit specific rheological properties may be correlated with some of the geometric parameters of the jet dispenser in order to generate drops of ink without clogging of the nozzle, accumulation of ink at the nozzle tip, and/or without formation of significant "satellite" droplets that accompany the principal drops that form the conductive trace. Several images of conductive traces 60A printed with a conductive ink that demonstrate successful drop generation are shown in FIGS. 2A to 2C. Conductive traces 60B printed with an ink that exhibits a viscosity that is too low results in the formation of substantial satellite drops 62 are shown in FIGS. 3A to 3C. Conductive traces 60C printed with an ink that exhibits a viscosity that is too high and results in poor drop ejection are shown in FIGS. 4A and 4B. In this case, the ink is so viscous that the printer can't generate enough pressure to form a clean drop.

Knowledge of this interaction between material properties and particular jet dispenser parameters (e.g., nozzle diameter, nozzle length, needle diameter, needle stroke length, feed pressure, etc.) is important when selecting or formulating inks. Conductive inks that are specifically designed to be jet dispensable are not believed to be commercially available. Jet dispensing is distinguishable from inkjet printing because the material properties that are necessary to successfully apply an ink to a substrate in these two printing methods are substantially different. Inkjet printing usually requires very low viscosity such as less than 0.02 Pa-s. It also requires small particle size of the conductive filler dispersed in the ink, typically less than 500 nm. On the other hand, jet dispensing can handle inks with much higher and broader viscosity range and inks with large particles or flakes. In addition, in order for screen printing inks to be used for jet dispensing, it is necessary to change or modify the composition of the ink.

The surface of the substrate may be 2-dimensional (2-D) or 3-dimensional (3-D) in shape. The substrate may be glass, ceramic, metal, and plastic. According to one aspect of the present disclosure, the substrate is a plastic substrate that may be formed, without limitation, from a polycarbonate, an acrylonitrile butadiene styrene (ABS), a polyamide, or a polyester, a polyimide, vinyl polymer, polystyrene, polyether ether ketone (PEEK), polyurethane, epoxy-based polymer, polyethylene ether, polyether imide (PEI), polyolefin, or a polyvinylidene fluoride (PVDF) material.

The conductive ink may comprise, but not be limited to, silver particles, silver flakes, gold particles, gold flakes, copper particles, copper flakes, palladium particles, palladium flakes, platinum particle, platinum flakes, or a combination thereof. The particles may include, without limitation, nanoparticles (<100 nm), submicron particles (<1 μm), micron-sized particles (≥1 μm), or a combination thereof. When desirable, the particles may exhibit a particle size distribution defined by a $D_{90}$ value that is ten μm or less; alternatively, five μm or less. The $D_{90}$ value is defined as the particle size value that corresponds to a cumulative size distribution at 90%, which represents the size of particles below which 90% of the particles lie. In some embodiments, the conductive ink may comprise the metal particles from about 50 wt. % to about 90 wt. % based on the overall weight of the conductive ink; alternatively, from about 60 wt. % to about 85 wt. %. This is different from previous jet dispensing in the arts, where particle free inks, or inks with low particle loading were used.

The conductive ink may comprise silver nanoparticles having an average particle diameter between about 2 nm and 800 nm. Optionally, one or more of these silver nanoparticles is at least partially encompassed with a hydrophilic coating. The silver nanoparticles may be incompletely fused after annealing, such that the average particle diameter of the silver nanoparticles in the conductive trace after annealing is substantially the same as that in the silver nanoparticle ink.

Figure 5:
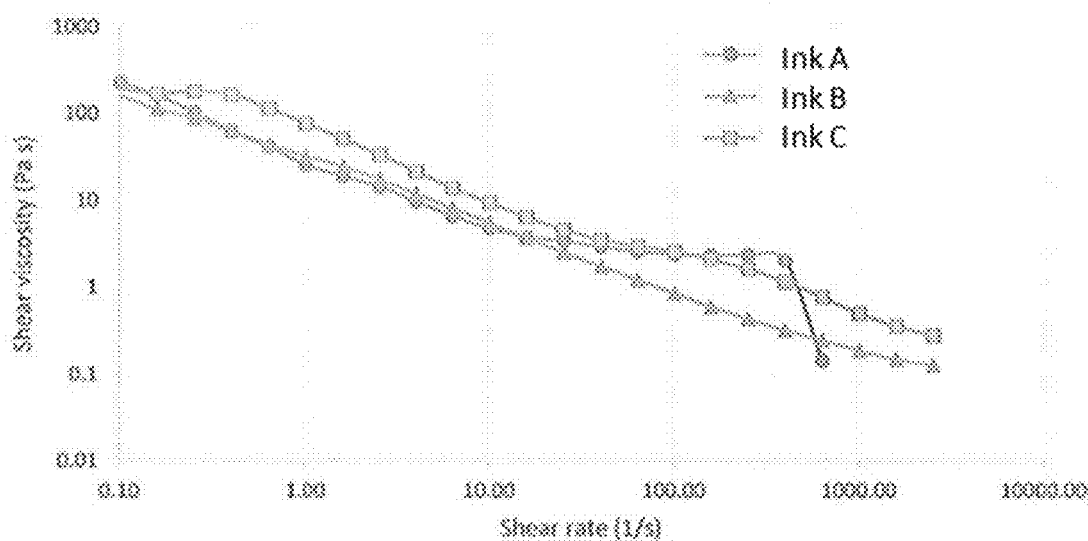
FIG. 5 is a plot of shear viscosity vs. shear rate for various conductive inks tested in a rheometer using continuous motion with sweeping strain rate and a parallel plate configuration.

The rheological behavior exhibited by conductive inks may be classified as shear-thinning in which the viscosity exhibited by the ink is dependent upon the shear rate. The shear rate found near the nozzle tip may be as high as 25,000 sec$^{-1}$. The shear-thinning behavior associated with the viscosity exhibited by several different conductive inks is shown in FIG. 5. A sharp decline in viscosity is observed to occur around 1000 sec$^{-1}$. Although not wanting to be held by theory, this sharp decline may be indicative of the onset of turbulent flow in the rheometer, or broken internal networks such as particle to particle interactions. Inks are found to be conducive to being printed successfully when they exhibit viscosities that are less than about 2.0 Pa-s measured at a shear rate of 700 sec$^{-1}$. Several inks with viscosities that have been printed successfully using a jet dispenser (e.g., Nordson EFD PICO, Nordson Asymtek DJ9500, etc.) fall within this window when measured at a temperature of 50° C. Inks that are higher in viscosity show significant ink accumulation at nozzle tip and eventual clogging, while inks that are lower in viscosity produce satellite drops.

In order for a drop to be successfully ejected from a jet dispenser and applied to a substrate, the Weber number (We) associated with the drop must exceed a critical value of 12. In other words, the inertia of a drop (e.g., velocity and density) must exceed the surface energy as described by $W_e$ as shown in Equation 1, $$We = (\rho V^2 D)/\sigma \qquad \text{Eq. 1}$$

wherein D is the drop diameter, V is the drop velocity, ρ is the density, and σ is the surface tension.

For high viscosity fluids, the viscous dissipation according the Ohnesorge number (Oh) as defined in Equation 2 must be taken into account.

$$Oh = m/((\Delta \rho D)\sigma)^{1/2} \qquad \text{Eq. 2}$$

The Ohnesorge number can be used to modify the Weber number as shown in Equation 3 to provide a critical Weber number ($We_{crit}$). Higher viscosity raises the critical Weber number, requiring greater inertia or drop size.

$$We_{crit} = 12(1 + 1.077 \, Oh^{1.6}) \qquad \text{Eq. 3}$$

Consistent with the Weber number, a greater drop velocity ($V_{jet}$) as defined in Equation 4 is relevant to drop ejection, wherein cp represents the flow rate coefficient for the nozzle. Drop velocity is a function of the pressure difference ($\Delta P$) above and below the nozzle. In addition, large needles or smaller nozzles create greater pressure.

$$V_{jet} = c_p[(2 \Delta P)/\rho]^{1/2} \quad \text{Eq. 4}$$

The jet dispenser may comprise a non-contact pulsable, piezo-actuated dispensing valve or a non-contact, pneumatic piston valve. In jet dispensing, force from needle impact creates a pressure gradient in the nozzle, which forces the fluid to be ejected from the nozzle. The jet dispenser is capable of being fired in rapid succession at a rate up to 250 Hz. The jet dispenser may also be capable of dispensing deposits of the conductive ink equal to or greater than 1 nL with a dot diameter on the order of 200 μm (0.008 in) or more. Several designs associated with jet dispensers may be found in U.S. Pat. No. 5,320,250, and in articles published by H. Quinones et al at *IMPAS Nordic*, Stockholm, Sweden, September, 2012; by S. Lu et al in *Smart Mater. Struct.* Vol. 24. 105023 (2015); and X. Y. She et al in *Sci. China Tech. Sci.*, vol. 53, pages 182-187 (2010), the contents of each being hereby incorporated in their entirety by reference. When desirable, the jet dispenser is similar to a Dispense-Jet® DJ-9500 jet dispenser (Nordson ASYMTEK, Carlsbad, Calif.).

During application of the ink to the surface of the substrate, the nozzle and the substrate are separated by a predetermined distance. This predetermined distance may be desirable or required in order to print on a curved surface or on a complex 3-D surface. This predetermined distance may range from about 1 mm to about 10 mm; alternatively, from about 1 mm to about 5 mm. The selected distance may affect the directionality of the ink droplets. The greater the distance, the greater the likelihood for deviation in the trajectory of the drops.

In general, when the measured viscosity is toward the higher limit, the process window in terms of needle stroke length and feed pressure decreases with larger nozzles and/or smaller needles. That is, higher viscosity inks require a nozzle and needle that generates more applied pressure to the fluid upon needle impact in order to create discrete drops as single drops or high frequency drop generation. Otherwise, ink tends to accumulate at the nozzle tip, which eventually breaks free from the nozzle as a large mass. At high frequencies, long "filaments" of ink may be extruded, creating a random walk pattern.

When the measured viscosity is toward the lower limit, the process window decreases when using smaller diameter nozzles or larger diameter needles. The high pressure generated in these cases tends to generate multiple drops, resulting in a spray of "satellite" drops around a central drop. Drop generation from the smallest nozzle available, 0.10 mm, is problematic because the orifice of the nozzle can more easily become clogged or plugged.

Referring once again to FIG. 1, the method may further comprise the steps of: applying 45 a primer layer to the surface of the substrate prior to the application of the conductive ink and at least partially curing 50 the primer layer. In this case, the conductive ink is applied onto the surface of the primer layer. The conductive ink may be dried or annealed at ambient or room temperature or at a temperature that is greater than ambient temperature. Alternatively, the temperature is less than about 200° C.; alternatively, less than about 160° C.; alternatively, no more than 120° C. for a period of time ranging between about 2 minutes to about 60 minutes. When desirable, the method may further comprise treating the surface of the substrate prior to the application of the primer layer. This surface treatment may include, without limitation, the use of atmospheric/air plasma, flame atomization, atmospheric chemical plasma, vacuum chemical plasma, UV exposure, UV-ozone exposure, heat treatment, chemical treatment, solvent treatment, mechanical treatment, or a corona charging process. Chemical treatment may include functionalization of the surface using known coupling agents or other surface treatments, including but not limited to alkoxy silanes.

According to another aspect of the present disclosure, functional conductive layered composites may be formed that incorporate the conductive trace created according to the method described above and further defined herein. This functional conductive layered composite may function, without limitation, as an antenna, as an electrode of an electronic device, or to interconnect two electronic components.

Figure 6:
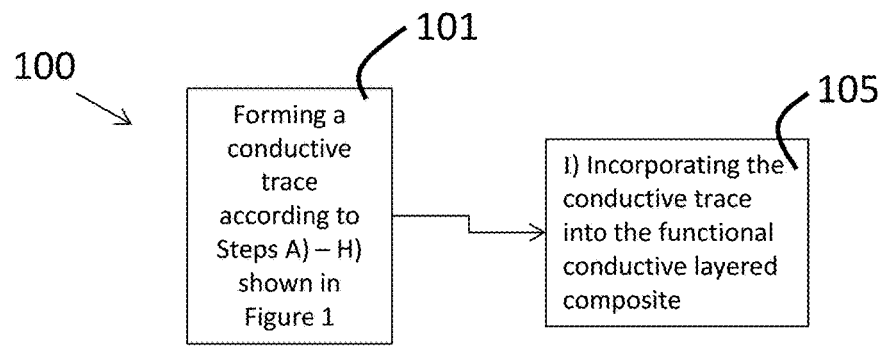
FIG. 6 is a schematic representation of method of forming a functional conductive layered composite comprising the conductive trace applied to a substrate according to FIG. 1.

Referring now to FIG. 6, a method 100 of forming a functional conductive layered composite comprises forming 101 a conductive trace on the surface of a substrate according to steps A) through H) as shown for method 1 in in FIG. 1, followed by step I) in which the conductive trace is incorporated 105 into a functional conductive layered composite. Optionally, the method may further comprise the steps of applying 45 a primer layer to the surface of the substrate prior to the application of the conductive ink and at least partially curing 50 the primer layer as previously described in FIG. 1. In this case, the conductive ink is applied onto the surface of the primer layer when forming the conductive trace. In other words, the primer layer may be considered to be part of the surface of the substrate for the application of the conductive ink.

The following specific examples are given to illustrate the printing of conductive traces according to the teachings of the present disclosure, as well as the functional composites formed therefrom and methods of preparing the same, and should not be construed to limit the scope of the disclosure. Those skilled-in-the-art, in light of the present disclosure, will appreciate that many changes can be made in the specific embodiments which are disclosed herein and still obtain a like or similar result without departing from or exceeding the spirit or scope of the disclosure. One skilled in the art will further understand that any properties reported herein represent properties that are routinely measured and can be obtained by multiple different methods. The methods described herein represent one such method and other methods may be utilized without exceeding the scope of the present disclosure.

Figure 7A:
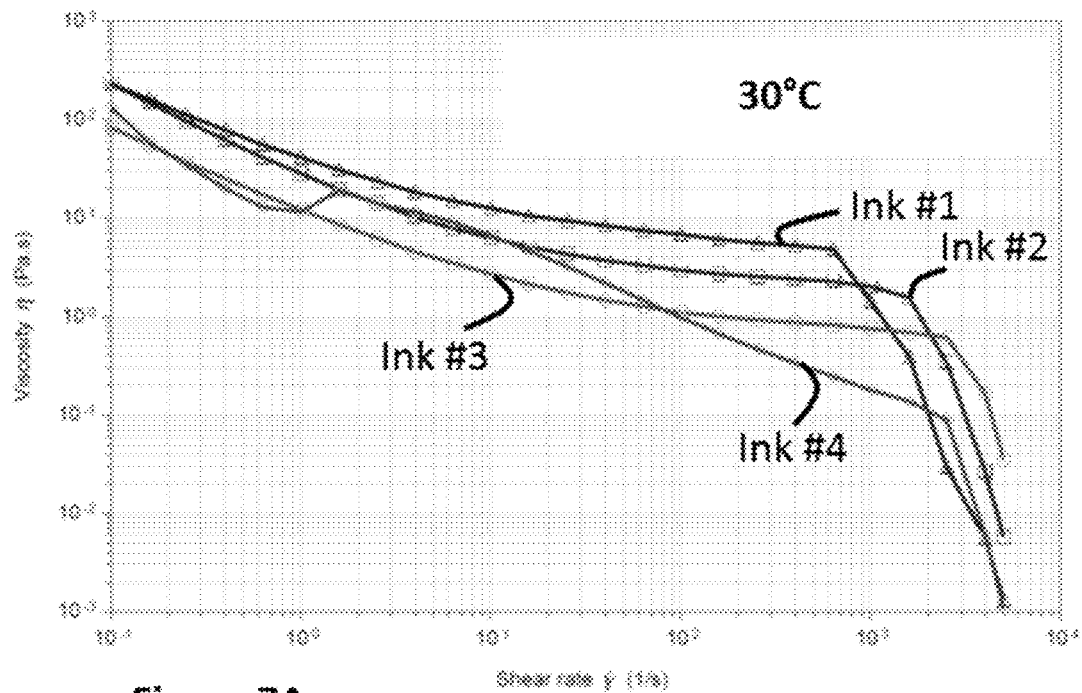
FIGS. 7A and 7B are plots of shear viscosity vs. shear rate for four inks measured at a temperature of 30° C. or 55° C.
Figure 7B:
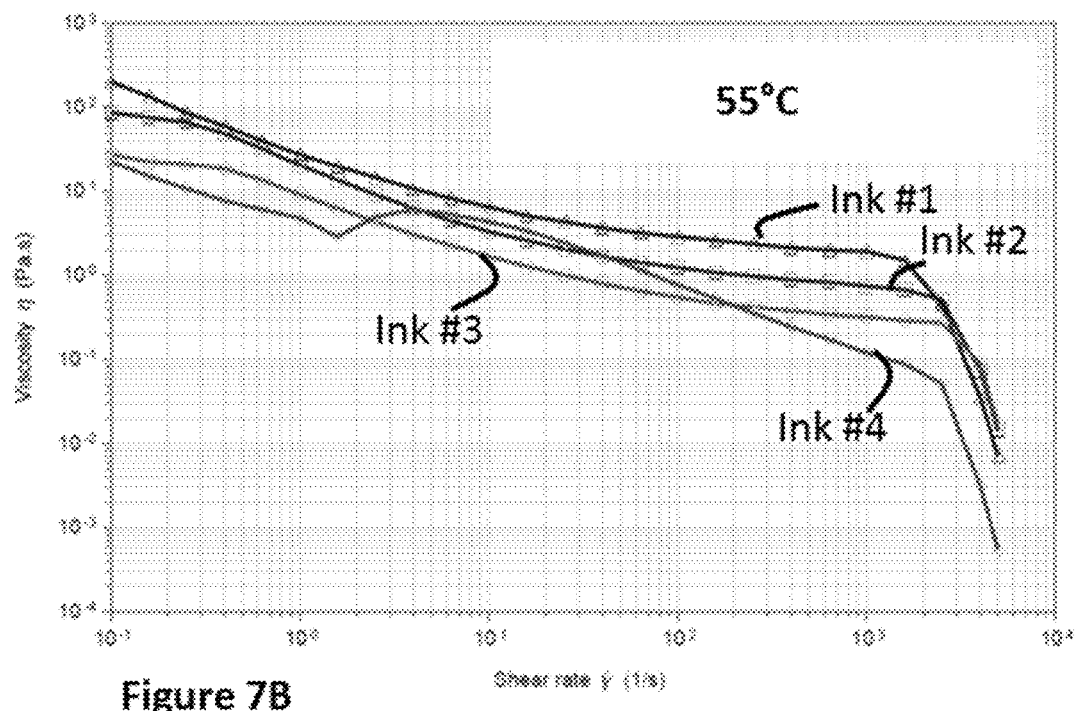

Four different conductive inks (ink #s 1-4) comprising a dispersion of metal particles, alternatively, silver particles, exhibited a viscosity range of 0.15 Pa-s to about 5.0 Pa-s as measured at a shear rate of 700 sec$^{-1}$ and at a temperature of 30° C. to 55° C. as shown in FIGS. 7A and 7B. The metal particle content in these conductive inks ranged from about 57 to about 73 wt. %, the polymeric binder ranged from about 8 to about 10 wt. %, and the organic solvent ranged from about 17 to about 35 wt. %, based on the overall weight of the conductive ink. The composition of Ink #s 1-3 may be further defined as comprising a thermoplastic binder, while ink #4 comprises a thermoset material. Ink #2 includes about 4 pph additional solvent. The viscosity of the shear thinning inks is measured using a rheometer in steady shear mode with a 50 mm parallel plate configuration. This testing involves applying a continuous rotation to measure viscosity as a function of shear rate from 0.1 to 5000 sec$^{-1}$ with the viscosity at 700 sec$^{-1}$ being used compare the different ink rheology. One skilled in the art will understand that other methods of testing or measuring viscosity, such as the use of a cone & plate or couette cell, can be utilized without exceeding the scope of the present disclosure.

The results of jet dispensing these inks onto a substrate to form a conductive trace are described in FIG. 8. The jetting parameters included a needle with a 3.0 mm diameter for all runs and a nozzle with a diameter (d) ranging from 0.10 mm to 0.25 mm. During these runs, the nozzles used include a nozzle length (L) of 4.5 mm or 0.8 mm with each length being available in a diameter (d) in the range of 0.10 mm to 0.25 mm. Thus the ratio of L/d for the nozzle with the 4.5 mm length ranged from 18 to 44, while the ratio for the nozzle with the 0.8 mm length ranged from 3.2 to 7.5.

Viscous inks are more difficult to apply via jet dispensing. Referring to FIG. 8, Ink #1 could not be applied with a viscosity of 5 Pa-s, but could be applied when the viscosity was on the order of about 2.0 Pa-s. In this FIG. 8, the viscosity of ink #1 was reduced by increasing the temperature in the dispensing nozzle from 30° C. to 55° C. Alternatively, a jet dispenser having a nozzle length (L) and nozzle diameter (d), such that the ratio of L/D is equal to about 5 can, in general, more readily be used to apply higher viscosity inks than a jet dispenser with the same nozzle diameter but having a ratio of L/D that is about 30.

Although not wanting to be held to theory, the pressure difference ($\Delta P$) required for laminar flow of a Newtonian fluid in a capillary is proportional to its length (L) as demonstrated by Poiseuille's Law as shown in Equation 5, $$\Delta P = (8 \mu L \, Q)/\pi r^4 \qquad \text{Eq. 5}$$

wherein L is the length of the nozzle, Q is the volumetric flow rate, $\mu$ is the dynamic viscosity of the conductive ink, and r is the radius of the nozzle's orifice. According to this equation when the dynamic viscosity ($\mu$) of the ink is high, the pressure differential ($\Delta P$) required for laminar flow is also high. Increasing this pressure differential may be accomplished by using a smaller diameter nozzle or using a larger diameter needle. Alternatively, the required pressure differential can be decreased by lowering the viscosity of the ink by raising the operating temperature or by using a nozzle having a smaller L/d ratio. Conversely, when the dynamic viscosity of the ink is low, the pressure differential required for laminar flow is also low. Decreasing the pressure differential may be accomplished by using a larger diameter nozzle or using a smaller diameter needle.

Figure 9A:
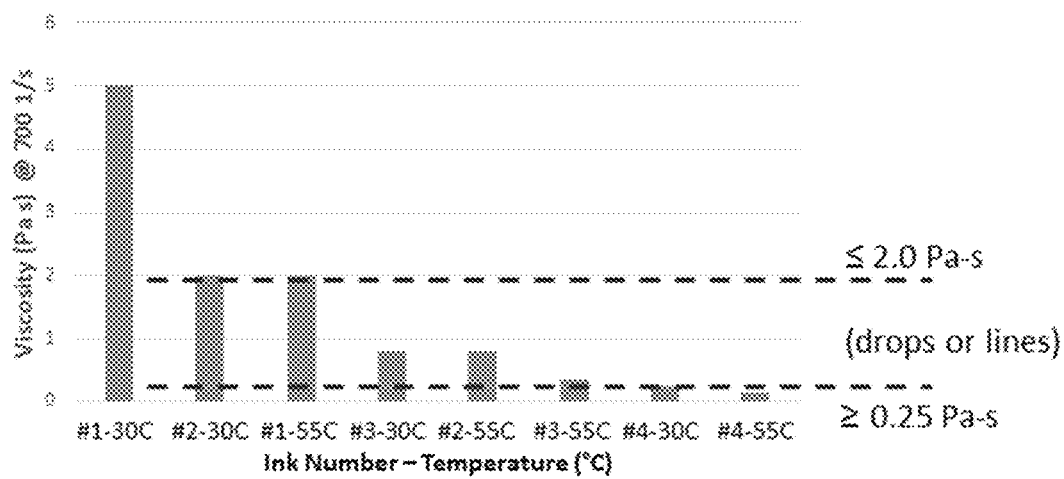
FIGS. 9A and 9B are graphical representations of the viscosity limits established for ink compositions with respect to jet dispensing according to the teachings of the present disclosure.
Figure 9B:
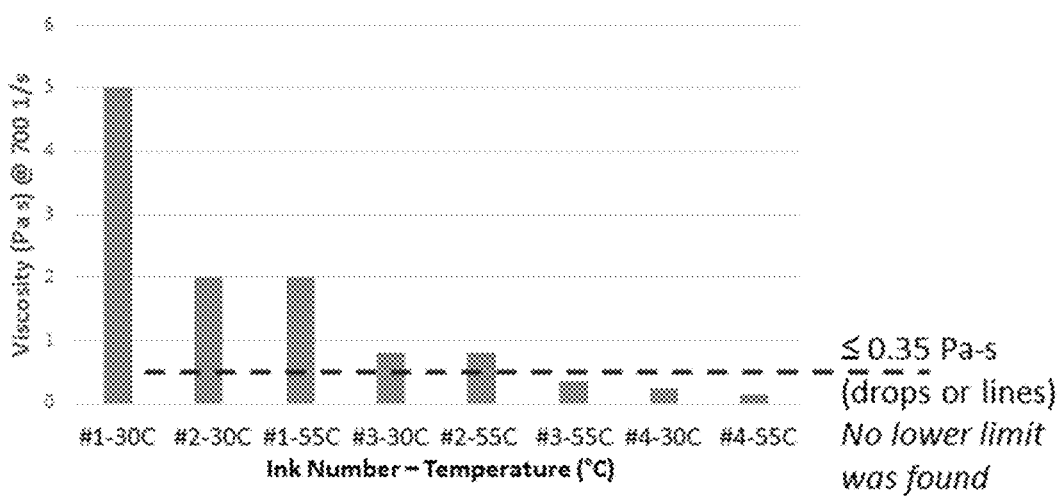

Although not wanting to be held to theory, the pressure difference ($\Delta P$) required for laminar flow of a Newtonian fluid in a capillary is The use of a smaller needle is capable of extending the useful range of viscosity exhibited by ink to the lower portion of the range as shown in Table 1. The viscosity limits established in the present disclosure with respect to jet dispensing are summarized in FIGS. 9A and 9B. More specifically, as shown in FIG. 9A, the use of a needle with a diameter of 3.0 mm, a nozzle a diameter equal to or greater than 0.15 mm and a ratio of L/d≤30 can apply an ink in drops (single drops or high frequency drop generation) and as lines when the viscosity of the ink is less than or equal to 2.0 Pa-s and greater than or equal to 0.25 Pa-s. Similarly, as shown in FIG. 9B, the use of a needle with a diameter of 1.0 mm, a nozzle with a diameter equal to or greater than 0.15 mm and a ratio of L/d≤30 can apply an ink in drops and as lines when the viscosity of the ink is less than or equal to 0.35 Pa-s.

TABLE 1

Effect of Needle Diameter

| Nozzle Diameter (mm) | Ink #4 - 30° C. | | Ink #4 - 55° C. | |
| --- | --- | --- | --- | --- |
| | Thermoset 3.2 needle | Thermoset 1.0 needle | Thermoset 3.2 needle | Thermoset 1.0 needle |
| 0.1 | x | x | x | x |
| 0.15 | lines = Yes dots = Yes | lines = Yes dots = Yes | lines = No dots = No | lines = Yes dots = Yes |
| 0.2 | lines = Yes dots = Yes | x | lines = Yes dots = No | x |
| 0.25 | x | x | x | x |

This example demonstrates that within the usable viscosity range, various combinations of jetting hardware (nozzle diameter, nozzle length, and needle diameter) and jetting parameters (nozzle temperature, needle stroke length, and feed pressure) can be used to control drop volume. For viscosities toward the higher limit, the process window in terms of needle stroke length and feed pressure decreases with larger nozzles and/or smaller needles. That is, higher viscosity inks require a nozzle and needle that generates more applied pressure to the fluid upon needle impact in order to create discrete drops. Otherwise, ink tends to accumulate at the nozzle tip, which eventually breaks free from the nozzle as a large mass (as shown in FIG. 4A). At high frequencies, long "filaments" of ink may be extruded, creating a random walk pattern (as shown in FIG. 4B). For viscosities toward the lower limit, the process window decreases when using smaller diameter nozzles or larger diameter needles. The high pressure generated in these cases tends to generate multiple drops, resulting in a spray of "satellite" drops around a central drop (as shown in FIG. 3B). Drop generation from the smallest nozzle available, e.g., 0.10 mm diameter, is problematic. Although not wanting to be held to theory, it is possible that the metal particles are too large and result in clogging of this small nozzle.

Within this specification, embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

The foregoing description of various forms of the invention has been presented for purposes of illustration and description. It is not intended to be exhaustive or to limit the invention to the precise forms disclosed. Numerous modifications or variations are possible in light of the above teachings. The forms discussed were chosen and described to provide the best illustration of the principles of the invention and its practical application to thereby enable one of ordinary skill in the art to utilize the invention in various forms and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a conductive trace on to a substrate, the method comprising:
   A) selecting a substrate;
   B) providing a jet dispenser for use in applying a conductive ink to the substrate;

C) selecting a conductive ink;
D) measuring the viscosity of the conductive ink at a shear rate of 700 sec$^{-1}$ and a predetermined jetting temperature;
E) using the measured viscosity ($V_m$) to select one of the following criteria (i)-(iv) to apply to the jet dispenser:
  (i) when the measured viscosity ($V_m$) is greater than 2.0 Pa-s, either (1) add a fluid to the conductive ink in order to reduce the viscosity thereof followed by repeating steps D) and E) or (2) select another conductive ink by repeating steps C)-E);
  (ii) when the measured viscosity ($V_m$) is less than or equal to 2.0 Pa-s and greater than 0.35 Pa-s, use a needle that is at least 3.0 mm in diameter and an orifice or nozzle that is at least 0.15 mm in diameter (d); with the proviso that the ratio of nozzle length (L) to nozzle diameter (d) is ≤30;
  (iii) when the measured viscosity ($V_m$) is less than 0.25 Pa-s, use a needle that is at least 1.0 mm in diameter but less than 3.0 mm in diameter and an orifice or nozzle that is at least 0.15 mm in diameter (d); with the proviso that the ratio of nozzle length (L) to nozzle diameter (d) is ≤30; or
  (iv) when the measured viscosity ($V_m$) is between 0.25 Pa-s and 0.35 Pa-s, use the criteria set forth in either (ii) or (iii);
F) applying the selected criteria to the jet dispenser;
G) using the jet dispenser to apply the conductive ink on to a surface of the substrate; and
H) drying or curing, and optionally annealing the conductive ink to form the conductive trace.

2. The method according to claim 1, wherein the jet dispenser comprises a non-contact pulsable, piezo-actuated dispensing valve or a non-contact, pneumatic piston valve.

3. The method according to claim 1, wherein the jet dispenser is capable of being fired in rapid succession at a rate up to 250 Hz.

4. The method according to claim 1, wherein the jet dispenser is capable of dispensing deposits of the conductive ink equal to or greater than 1 nL with a dot diameter on the order of 200 µm (0.008 in) or more.

5. The method according to claim 1, wherein the substrate is a glass, a metal, a ceramic, or a plastic substrate.

6. The method according to claim 1, wherein the surface of the substrate is 2-dimensional (2-D) or 3-dimensional (3-D).

7. The method according to claim 5, wherein the substrate is a plastic substrate formed from a polycarbonate, an acrylonitrile butadiene styrene (ABS), a polyamide, or a polyester, a polyimide, vinyl polymer, polystyrene, polyether ether ketone (PEEK), polyurethane, epoxy-based polymer, polyethylene ether, polyether imide (PEI), polyolefin, or a polyvinylidene fluoride (PVDF) material.

8. The method according to claim 1, wherein the conductive ink comprises silver particles, silver flakes, gold particles, gold flakes, copper particles, copper flakes, palladium particles, palladium flakes, platinum particle, platinum flakes, or a combination thereof.

9. The method according to claim 1, wherein the measured viscosity of the conductive ink is between 0.25 Pa-s and 0.35 Pa-s.

10. The method according to claim 1, wherein the method further comprises:
applying a primer layer to the surface of the substrate prior to the application of the conductive ink; and
at least partially curing the primer layer;
wherein the conductive ink is applied onto the surface of the primer layer.

11. The method according to claim 1, wherein the method further comprises treating the surface of the substrate using atmospheric/air plasma, flame atomization, atmospheric chemical plasma, vacuum chemical plasma, UV exposure, UV-ozone exposure, heat treatment, chemical treatment, solvent treatment, mechanical treatment, or a corona charging process prior to the application of the primer layer.

12. The method according to claim 1, wherein the conductive ink is dried or annealed at a temperature ranging from ambient temperature to less than about 200° C. for a period of time ranging between about 2 minutes to about 60 minutes.

13. The method according to claim 1, wherein the conductive ink comprises silver nanoparticles having an average particle diameter between about 2 nanometers and 800 nanometers; optionally, one or more of the silver nanoparticles is at least partially encompassed with a hydrophilic coating.

14. The method according to claim 13, wherein the silver nanoparticles are incompletely fused after annealing, such that the average particle diameter of the silver nanoparticles in the conductive trace after annealing is substantially the same as that in the silver nanoparticle ink.

15. A method of forming a functional conductive layered composite comprising:
  A) selecting a substrate;
  B) providing a jet dispenser for use in applying a conductive ink to the substrate;
  C) selecting a conductive ink;
  D) measuring the viscosity of the conductive ink at a shear rate of 700 sec$^{-1}$ and a predetermined jetting temperature;
  E) using the measured viscosity to select one of the following criteria (i)-(iv) to apply to the jet dispenser:
    (i) when the measured viscosity is greater than 2.0 Pa-s, either (1) add a fluid to the conductive ink in order to reduce the viscosity thereof followed by repeating steps D) and E) or (2) select another conductive ink by repeating steps C)-E);
    (ii) when the measured viscosity is less than or equal to 2.0 Pa-s and greater than 0.35 Pa-s, use a needle that is at least 3.0 mm in diameter and an orifice or nozzle that is at least 0.15 mm in diameter (d); with the proviso that the ratio of nozzle length (L) to nozzle diameter (d) is ≤30;
    (iii) when the measured viscosity is less than 0.25 Pa-s, use a needle that is at least 1.0 mm in diameter but less than 3.0 mm in diameter and an orifice or nozzle that is at least 0.15 mm in diameter (d); with the proviso that the ratio of nozzle length (L) to nozzle diameter (d) is ≤30; or
    (iv) when the measured viscosity is between 0.25 Pa-s and 0.35 Pa-s, use the criteria set forth in either (ii) or (iii);
  F) applying the selected criteria to the jet dispenser;
  G) using the jet dispenser to apply the conductive ink on to a surface of the substrate; and
  H) drying or curing, and optionally annealing the conductive ink to form the conductive trace, and
  I) incorporating the conductive trace into the functional conductive layered composite.

16. The method according to claim 15, wherein the method further comprises:
applying a primer layer to the surface of the substrate prior to the application of the conductive ink; and at least partially curing the primer layer;

wherein the conductive ink is applied onto the surface of the primer layer.

17. The method according to claim 15, wherein the jet dispenser is capable of dispensing deposits of the silver nanoparticle ink as small as 1 nL with a dot diameter as low as 200 μm (0.008 in) fired in rapid succession at a rate in excess of 150 Hz.

18. The method according to claim 15, wherein the conductive ink comprises silver nanoparticles having an average particle diameter between about 2 nanometers and 800 nanometers; optionally, one or more of the silver nanoparticles is at least partially encompassed with a hydrophilic coating.

\* \* \* \* \*